US009829886B2

(12) United States Patent
Yang et al.

(10) Patent No.: US 9,829,886 B2
(45) Date of Patent: Nov. 28, 2017

(54) FLIGHT CONTROL SYSTEM, A CIRCUIT BOARD ASSEMBLY AND A CONFIGURATION METHOD THEREOF

(71) Applicant: ZEROTECH (Shenzhen) Intelligence Robot Co., Ltd., Shenzhen (CN)

(72) Inventors: Jianjun Yang, Beijing (CN); Shijun Wu, Beijing (CN); Hao Wang, Beijing (CN); Jun Li, Beijing (CN); Yun Xie, Beijing (CN)

(73) Assignee: ZEROTECH (SHENZHEN) INTELLIGENCE ROBOT CO., LTD., Longgang District, Shenzhen (CN)

( * ) Notice: Subject to any disclaimer, the term of this patent is extended or adjusted under 35 U.S.C. 154(b) by 21 days.

(21) Appl. No.: 15/141,838

(22) Filed: Apr. 29, 2016

(65) Prior Publication Data
US 2017/0196087 A1    Jul. 6, 2017

(30) Foreign Application Priority Data

Jan. 5, 2016   (CN) .......................... 2016 1 0007072
Jan. 5, 2016   (CN) .................... 2016 2 0008758 U
(Continued)

(51) Int. Cl.
*B64D 47/08*     (2006.01)
*G05D 1/00*      (2006.01)
(Continued)

(52) U.S. Cl.
CPC ......... *G05D 1/0088* (2013.01); *B64C 39/024* (2013.01); *B64D 31/06* (2013.01);
(Continued)

(58) Field of Classification Search
CPC . H05K 1/141; H05K 1/08; H05K 3/36; B64C 39/024; B64C 2201/146; B64D 31/06; B64D 47/08; G05D 1/0088
See application file for complete search history.

(56) References Cited

U.S. PATENT DOCUMENTS 4,314,307  A  *  2/1982  Sivahop ............... H01H 47/001
                                                        307/142
4,608,531  A  *  8/1986  Stephens .............. G01R 31/008
                                                        324/73.1
(Continued)

OTHER PUBLICATIONS

Oshman et al., Mini-UAV Attitude Estimation Using an Inertially Stabilized Payload, 1999, IEEE, p. 1191-1203.*

(Continued)

*Primary Examiner* — McDieunel Marc
(74) *Attorney, Agent, or Firm* — Jun He Law Offices P.C.; James J. Zhu

(57) ABSTRACT

A flight control system is provided. The system includes a primary circuit board, a secondary circuit board electrically connected to the primary circuit board, a system on chip (SOC) integrated chip, a power management chip configured to supply power to the SOC integrated chip, an electronic speed control (ESC) driving circuit module configured to control flight speed in response to an instruction from the SOC integrated chip. In the system, the SOC integrated chip and the power management chip are arranged on the primary circuit board, and the ESC driving circuit module is arranged on the secondary circuit board.

18 Claims, 3 Drawing Sheets

(30) Foreign Application Priority Data

Jan. 5, 2016 (CN) .................. 2016 2 0010272 U
Jan. 5, 2016 (CN) .................. 2016 2 0010286 U
Jan. 5, 2016 (CN) .................. 2016 2 0010328 U

(51) Int. Cl.

| | |
|---|---|
| *B64C 39/02* | (2006.01) |
| *H04N 5/232* | (2006.01) |
| *B64D 31/06* | (2006.01) |
| *H05K 1/14* | (2006.01) |
| *H05K 1/18* | (2006.01) |
| *H05K 3/36* | (2006.01) |

(52) U.S. Cl.
CPC ........... *B64D 47/08* (2013.01); *G05D 1/0038* (2013.01); *G05D 1/0094* (2013.01); *H04N 5/23254* (2013.01); *H04N 5/23267* (2013.01); *H05K 1/141* (2013.01); *H05K 1/18* (2013.01); *H05K 3/36* (2013.01); *B64C 2201/127* (2013.01); *B64C 2201/141* (2013.01); *B64C 2201/146* (2013.01)

(56) References Cited

U.S. PATENT DOCUMENTS

| | | | | |
|---|---|---|---|---|
| 5,241,892 | A * | 9/1993 | Ousterhout | F42C 17/04 89/6.5 |
| 6,965,816 | B2 * | 11/2005 | Walker | B64C 13/20 244/189 |
| 7,535,958 | B2 * | 5/2009 | Best | H04B 1/7183 375/130 |
| 9,527,588 | B1 * | 12/2016 | Rollefstad | B64C 39/024 |
| 2015/0229912 | A1 * | 8/2015 | Masalkar | G01S 7/481 348/46 |
| 2017/0106986 | A1 * | 4/2017 | Sweeny | B64C 25/58 |
| 2017/0147214 | A1 * | 5/2017 | Ray | G06F 3/061 |

OTHER PUBLICATIONS

Mallick et al., Design & Implementation of an UAV (Drone) with Flight Data Record, 2016, IEEE, p. 1-6.*
Rafique et al., Design and Implementation of a UAV for Power System utility Inspection, 2014, IEEE, p. 1146-1150.*
Liu et al., Design and Realization of Data Acquiring System for Vehicle Speed Sensor and Gyroscope, 2010, IEEE, p. 281-283.*

* cited by examiner

FLIGHT CONTROL SYSTEM, A CIRCUIT BOARD ASSEMBLY AND A CONFIGURATION METHOD THEREOF

CROSS-REFERENCE TO RELATED APPLICATIONS

The present application is based on, and claims priority from China Application Serial Number 201610007072.8, filed on Jan. 5, 2016; China Application Serial Number 201620010286.6, filed on Jan. 5, 2016; China Application Serial Number 201620008758.4, filed on Jan. 5, 2016; China Application Serial Number 201620010328.6, filed on Jan. 5, 2016; China Application Serial Number 201620010272.4, filed on Jan. 5, 2016, the disclosure of which are hereby incorporated by reference herein in its entirety.

TECHNICAL FIELD

The present disclosure relates to a flight control system, a circuit board assembly of a flight control system, and a method of configuring a circuit board assembly of a flight control system.

BACKGROUND

With the continuous development of aviation technology, aerial apparatuses have been widely used in military and civilian fields, aerial apparatus refers to an aircraft or unmanned aerial vehicles (UAVs) and other aerial devices with flight capabilities and so on. Aerial apparatus has been widely used in geological disaster monitoring, forest fire prevention, aerial mapping, environmental monitoring and detection of target and other fields.

A typical UAV may carry onboard a variety of electrical components used to control various aspects of the operation of the UAV. For example, a flight control module is electrically connected to other auxiliary components, such as electronic speed control (ESC) modules, Pan-Tilt-Zoom (PTZ) modules. Further, the flight control module, via a wireless transmitter module, performs data interaction with a GCS (ground control Station) terminal module.

At the same time, the UAV sometimes also needs to carry one or more sensors for navigational, surveillance or remote sensing purposes. For example, a flight sensor module may include one or more sensors, such as a direction sensor, a height sensor, and a position sensor. In order to ensure normal flight of aerial UAV, the flight control module is also electrically connected to a power supply module, a system clock module, a LED light, etc.

In a typical configuration of the circuit board, the flight control module and the ESC driving circuit module are integrated in a single circuit board, while other components such as the flight sensor modules are integrated in a different circuit board.

SUMMARY

An example flight control system of the disclosure includes a primary circuit board, a secondary circuit board electrically connected to the primary circuit board, a system on chip (SOC) integrated chip, a power management chip configured to supply power to the SOC integrated chip, an electrically speed control (ESC) driving circuit module configured to control flight speed in response to an instruction from the SOC integrated chip. In the example system, the SOC integrated chip and the power management chip are arranged on the primary circuit board, and the ESC driving circuit module is arranged on the secondary circuit board.

An example circuit board assembly of a flight control system of the disclosure includes a primary circuit board and a SOC integrated chip and a power management chip electrically connected to the SOC integrated chip are arranged on the primary circuit board. The assembly further includes a secondary circuit board and an ESC driving circuit module electrically connected to the SOC integrated chip is arranged on the secondary circuit board. In the assembly, the primary circuit board is electrically connected to the secondary circuit board.

An example method of configuring a circuit board assembly of a flight control system of the disclosure includes arranging a SOC integrated chip and a power management electrically connected to the SOC integrated chip on a circuit board, and setting the circuit board as a primary circuit board. The method further includes arranging a ESC driving circuit module electrically connected to the SOC integrated chip on another circuit board, and setting the another circuit board as a secondary circuit board. The method further includes electrically connecting the secondary circuit board into the primary circuit board.

It is to be understood that both the foregoing general description and the following detailed description are exemplary and explanatory only, and are not restrictive of the invention. Further, the accompanying drawings, which are incorporated in and constitute a part of this specification, illustrate embodiments of the invention and together with the description, serve to explain principles of the invention.

BRIEF DESCRIPTION OF THE FIGURES

The drawings referenced herein form a part of the specification. Features shown in the drawing illustrate only some embodiments of the disclosure, and not of all embodiments of the disclosure, unless the detailed description explicitly indicates otherwise, and readers of the specification should not make implications to the contrary.

The same reference numbers will be used throughout the drawings to refer to the same or like parts.

DETAILED DESCRIPTION

Figure 1:
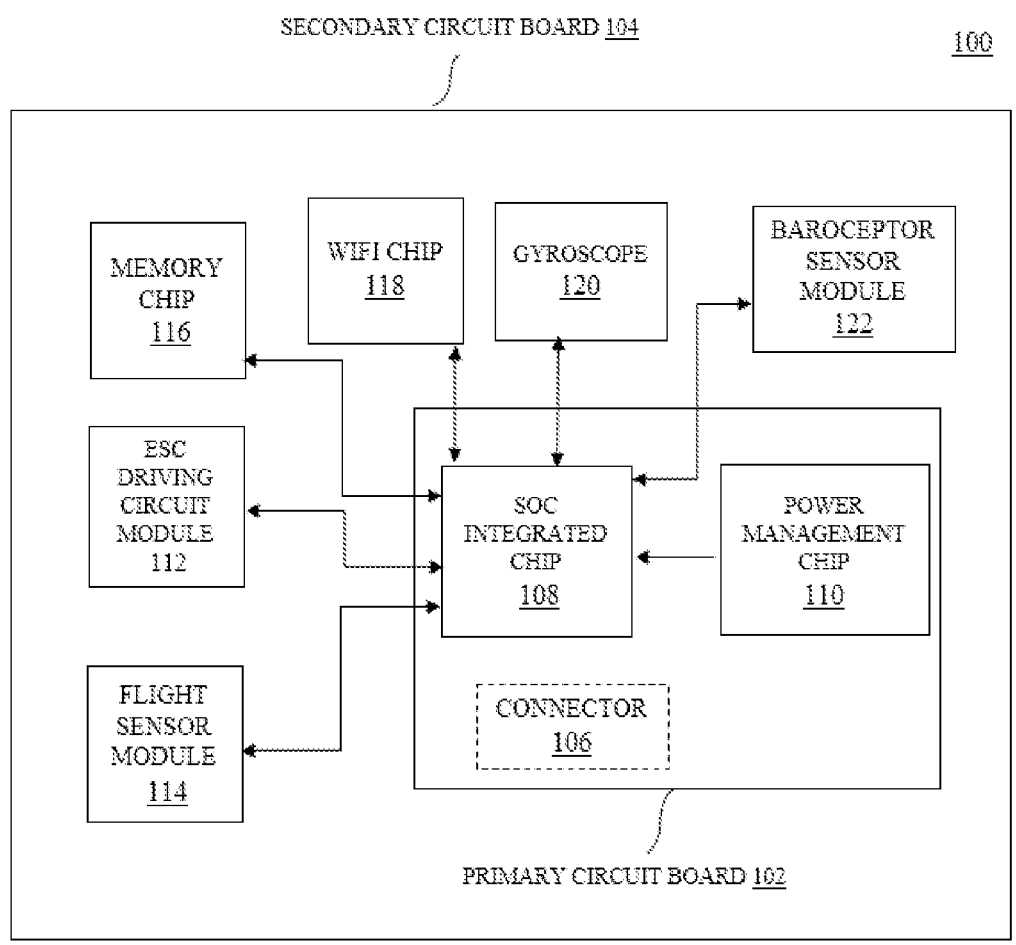
FIG. 1 is a diagram of an example flight control system, according to embodiments of the invention.

The following detailed description of exemplary embodiments of the disclosure refers to the accompanying drawings that form a part of the description. The drawings illustrate specific exemplary embodiments in which the disclosure may be practiced. The detailed description, including the drawings, describes these embodiments in sufficient detail to enable those skilled in the art to practice the disclosure. Those skilled in the art may further utilize other embodiments of the disclosure, and make logical, mechanical, and other changes without departing from the spirit or scope of the disclosure. Readers of the following detailed description should, therefore, not interpret the description in a limiting sense, and only the appended claims define the scope of the embodiment of the disclosure.

In this application, the use of the singular includes the plural unless specifically stated otherwise. In this application, the use of "or" means "and/or" unless stated otherwise. Furthermore, the use of the term "including," as well as other forms such as "includes" and "included," is not limiting. In addition, terms such as "element" or "component" encompass both elements and components comprising one unit, and elements and components that comprise more than one subunit, unless specifically stated otherwise. Additionally, the section headings used herein are for organizational purposes only, and are not to be construed as limiting the subject matter described.

As noted in the background section, in the typical configuration of the circuit board, the flight control circuit module and the ESC driving circuit module are integrated in a circuit board. The present inventors have recognized that in this configuration of the circuit board, the wiring distance of the circuit board is long, and the size of the circuit board is big. Also, this configuration of the circuit board does not facilitate a function expansion to modules with additional features on the circuit board, thus, is not conducive to product updates.

Further, at the present, cell phone chips or integrated chips have been used in the UAV flight control system. Due to small size and light weight of the integrated chips or the cell phone chips, the size of a control circuit board with the integrated chip or the cell phone chip can be made very small. Take the cell phone chip as an example, while being used in UAV, the control circuit board with the cell phone chip and a power management chip is configured as a primary circuit board. The primary circuit board is relatively costly but provides many interfaces for future development/expansion. If other function modules with additional features are also integrated in the primary circuit board, when these modules with additional features need to be further developed, revision of the primary circuit board is costly. Thus, this circuit board layout mode where the cell phone chip and other function modules share a primary circuit board is not desirable.

The present inventors have further recognized that the ESC driving circuit module is required to drive a motor, which operates within a strong electric range. The flight control circuit module, as well as some auxiliary circuit modules, such as flight sensor modules, pressure sensor modules, USB conversion modules, key modules, storage modules, LED modules, etc. operate within a weak electric range. Thus, electrical interference and signal strength instability may arise therebetween. To address this issue, a typical circuit board design layout mode is configured that each of the flight control module, the ESC driving circuit module and the auxiliary circuit modules is arranged on a separate circuit board, respectively. In other words, the ESC driving circuit module is arranged on a separate circuit board. However, in this circuit board design layout mode, the number of circuit boards increases, connections between the circuit boards are redundant, and the structure is not compact.

Disclosed herein are techniques to address these problems mentioned in the background part. In accordance with the techniques disclosed herein, a primary circuit board and a secondary circuit board are provided. The SOC integrated chip and the power management chip are arranged on the primary circuit board, and the ESC driving circuit module is arranged on the secondary circuit board. The primary circuit board of the flight control system is compact, and functions extensions can be developed to other function modules on the secondary circuit board. In this way, revision of the primary circuit board is less, effectively saving the cost. Also, interference of the ESC driving circuit module to the SOC integrated chip can be prevented.

FIG. 1 illustrates an example flight control system 100. In FIG. 1, the flight control system 100 includes a primary circuit board 102 and a secondary circuit board 104. In some embodiments, the secondary circuit board 104 is multiple layers printed circuit board. The primary circuit board 102 is electrically connected to the secondary circuit board 104. The connection between the primary circuit board 102 and the secondary circuit board can be achieved in many ways. For example, the connection is achieved via a removable plugging of a connector 106, which is receptive to the primary circuit board 102 and the secondary circuit board 104. The connector 106 is thus electrically connected to the secondary circuit board 104, and the plugging of a primary circuit board 102 into the connector 106 results in the primary circuit board 102 being electrically connected to the connector 106. In this way, the secondary circuit board 104 becomes electrically connected to the primary circuit board 102. Alternatively, the connector 106 is electrically connected to the primary circuit board 102, and the plugging of a secondary circuit board 104 into the connector 106 results in the secondary circuit board 104 being electrically connected to the primary circuit board 102. In some embodiments, the connector 106 include 120 pins.

The flight control system 100 also includes other multiple components. These components may perform various operations including, for example, exchanging and processing information, providing and managing power supply, and varying flight speed and direction. In the example of FIG. 1, these multiple components at least include an integrated system on chip (SOC) chip 108, a power management chip 110, an ESC driving circuit module 112, a flight sensor module 114, a memory chip 116, and a wifi chip 118. Although the flight control system 100 includes these multiple components, persons of ordinary skill in the art will recognize that the flight control system 100 may include any number of additional components without departing from the spirit or scope of the present invention.

The system on chip (SOC) integrated chip 108 may represent any integrated circuit (IC) that integrates all components of a computer or other electronic system into a single chip for allowing the flight control system 100 to be in operation. For example, the SOC integrated chip 108 may include a signal processor to run the flight control system 100, an image processing unit and a graphics processor chip. The signal processor, for example, may be one of an ARM processor, DSP (digital signal processor) and FPGA (Field Programmable Gate array). An example of the SOC integrated chip 108 is Innopower® LC1860C chip provided by Leadcore Technology Co. Ltd, which could enable the features including: high resolution video, communication and navigation, camera and sensor support, power charging. Without departing the spirit or scope of the disclosure other commercially available SOC chips can be used.

In the embodiments described herein, the SOC chip 108 is arranged on the primary circuit board and configured to provide control signals to the ESC driving circuit module 112, the flight sensor module 114, the memory chip 116, and the wifi chip 118, respectively, and receive feedback signals from the ESC driving circuit module 112, the flight sensor module 114, the memory chip 116, and the wifi chip 118, respectively.

The power management chip 110 refers to any IC for managing power requirements of the flight control system 100. In the particular example of FIG. 1, the power management chip 110 is arranged on the primary circuit board and configured to supply power to the SOC integrated chip 108.

The ESC driving circuit module 112 represents an electronic circuit for managing speed and direction requirements of the flight control system 100. For example, the ESC driving circuit module 112 can be adapted to control the operation of a motor (not shown) by controlling the flow, or current, of electricity to the motor. In the embodiments described herein, the ESC driving circuit module 112 is arranged on the secondary circuit board 120 and is electrically connected to the SOC integrated chip 108. In this way, the SOC integrated chip 108 provides control signals for the ESC driving circuit module 112, which in turn provides signals to the electrically connected motor so as to control the motor. Further, feedback signals can also be provided by the ESC driving circuit module to the SOC integrated chip 108.

The multiple components described above may be distributed across multiple printed circuit boards. In some embodiments, the SOC integrated chip 108 and the power management chip 110 are arranged on the primary circuit board 102, and the ESC driving circuit module 112 is arranged on the secondary circuit board 104. Alternatively, the power management chip 110 is arranged on the secondary circuit board 104.

The flight sensor module 114 refers to a sensor or a sensor cluster that is able to detect parameters that facilitate the UAV's operation. For example, these parameters include, but not limited to, orientation, velocity and acceleration of the UAV, pitch, roll and yaw of the UVA. As depicted in FIG. 1, the flight sensor module 114 is arranged on the secondary circuit board and is electrically connected to the SOC integrated chip 108. By such an arrangement, the primary circuit board is kept concise. At the same time, the flight sensor module 114 on the secondary circuit board can be further developed without re-designing the primary circuit board. Further, as described in details below in connection with FIG. 2, by special arrangement of ESC driving circuit module 112, the interference between flight sensor module 114 and ESC driving circuit module 112 on the same circuit board can be effectively reduced, though they operate within different voltage range. In actual implementation, the SOC integrated chip 108 send flight control instructions to multiple components based on sensor data from the flight sensor module 114 so that the UAV operates in a desirable way, for example, maintaining stable flight and being able to launch, land and fly between way points along a path.

In some embodiments, the flight sensor module 114 includes at least one sensor selected from the group consisting of an IMU, a level sensor, a direction sensor, a position sensor and a distance sensor. The functions of the respective sensors above are detailed as follow: the IMU is used for detecting attitude, speed, acceleration of the UAV; the height sensor is used for detecting the height of UAV; the direction sensor is used for detecting the direction of UAV; the position sensor and the distance sensor is used for detecting the position of the UAV. However, the flight sensor module 114 is not limited to such configuration, and, in additional embodiments, the flight sensor module 114 may also include any other type sensors.

However, the arrangement of the flight sensor module 114 is not limited to such configurations. In alternative embodiments, the flight sensor module 114 may be integrated into the primary circuit board 102, provided that the primary circuit board or the SOC are developed more and more advanced in future.

In additional embodiments, the flight sensor module 114 includes a plurality of sensors, and the plurality of sensors are distributed across both the primary circuit board 102 and the secondary circuit board 104. As an example, the flight sensor module 114 includes the IMU, the height sensor, and the direction sensor. The IMU is arranged on the primary circuit board 102, and the height sensor and the direction sensor are arranged on the circuit board 104.

The Memory chip 116 refers to any IC that stores data and computer-executable instructions to allow the processor of the SOC integrated chip 108 to process. An example of the memory chip 116 may include, but not limited to, DRAM (Dynamic random access memory) chips, SRAM (Static random access memory) chips, FIFO (First in, first out) memory chips, EPROM (Erasable programmable read only memory), PROM (Programmable read only memory). As depicted in FIG. 1, the memory chip 116 is arranged on the secondary circuit board 104 and is electrically connected to the SOC integrated chip 108. For example, the memory chip 116 Memory may store data that includes measurement locations, travel paths, launch locations, and landing locations such that the processor of the SOC integrated chip 108 will use instructions to control multiple components and operate UAV in a desired way, for example, moving along a desired path, instructing the flight sensor module 114 to take measurements at measurement locations, attaining a desired altitude at a desired image capture location, flying between image capture locations, etc. In some embodiments, the memory chip 116 is arranged on the primary circuit board 102 and is electrically connected to the SOC integrated chip 108.

The wifi chip 118 can perform wireless connectivity and communication via mechanisms WiFi (e.g., IEEE 802.11). In FIG. 1, the wifi chip 118 is arranged on the secondary circuit board 104 and is electrically connected to the SOC integrated chip 108. For example, the wifi chip 118 can transmit and/or receive processing results produced by the SOC integrated chip 108, user commands from a terminal or remote controller, and the like. In some embodiments, the wifi chip 118 is arranged on the primary circuit board 102 and is electrically connected to the SOC integrated chip 108.

In some embodiments, the flight control system 100 may further include other function modules not depicted in FIG. 1. For example, the flight control system 100 may include a gyroscope 120, and the gyroscope 120 is arranged on the secondary circuit board 104. Additionally, the flight control system may further include a baroceptor sensor module 122, and the baroceptor sensor module 122 is arranged on an area of the secondary circuit board 104 that has no through holes, and arranged in a distance from heat-dissipating electrical components. This arrangement will avoid affecting sampled data of the baroceptor sensor module 122. Also, modules such as a GPS module, a pressure sensor module, a USB conversion module, a key module, LED module, and an ultrasonic module can be configured in the flight control system 100. The USB converter module can be used to convert other types of interfaces into a USB interface. These modules can be integrated in the secondary circuit board 104 to perform function extension and reduce the cost of such function extension.

In the example of FIG. 1, the ESC driving circuit module 112 is arranged on the secondary circuit board 102 and is electrically connected to the SOC integrated chip 108. Additionally, or independently, an example of the ESC driving circuit module 112 is described herein with reference to FIG. 2, although the ESC driving circuit module can take a different form, other than that of FIG. 2.

Figure 2:
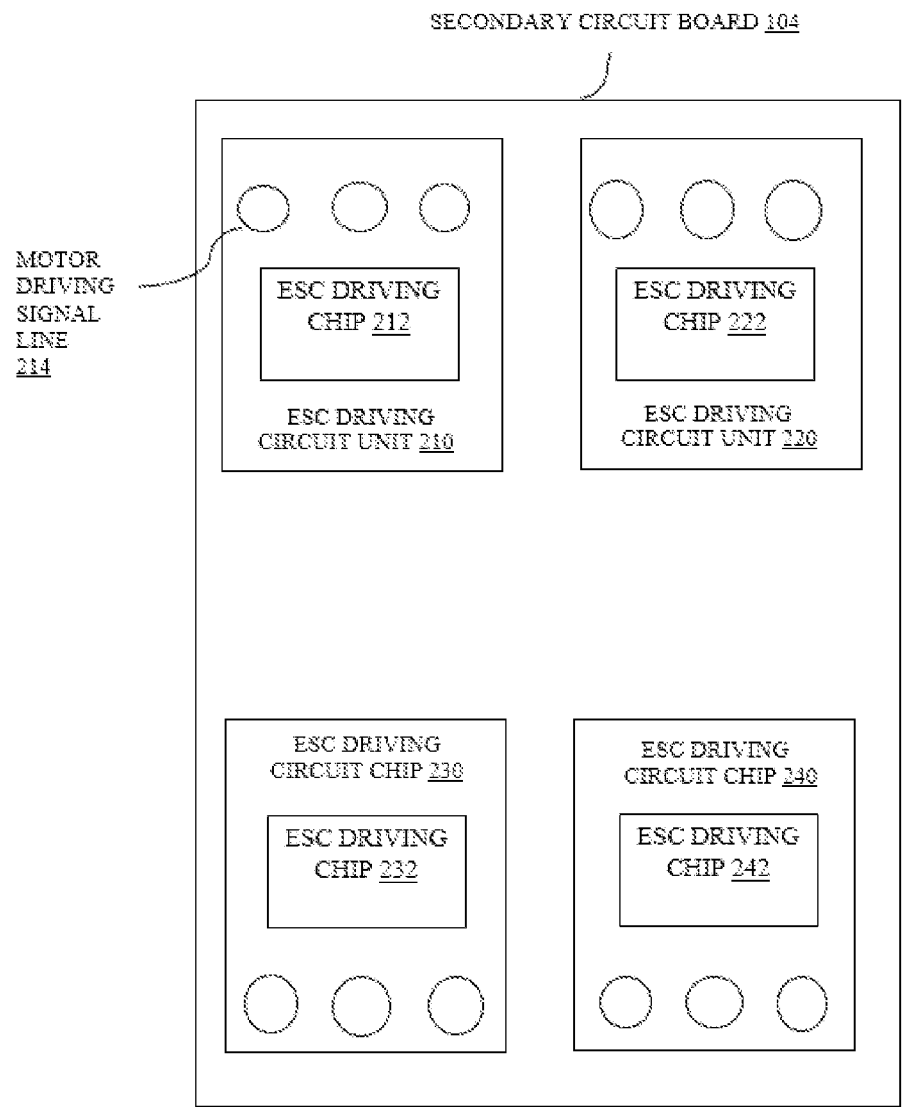
FIG. 2 is a diagram of an example ESC driving circuit module, according to embodiments of the invention.

FIG. 2 schematically illustrates an example ESC driving circuit module 112 which is arranged on the secondary circuit board 104. The ESC driving circuit module 112 includes at least one ESC driving circuit unit, for example, four ESC driving circuit units 210, 220, 230, and 240, as explicitly shown in FIG. 2. Each of the four ESC driving circuit units 210, 220, 230, and 240 is configured to manage speed requirements. For example, the input of each of the four ESC driving circuit units 210, 220, 230, and 240 is electrically connected to the output of the SOC integrated chip 108. In some embodiments, the four ESC driving circuit units 210, 220, 230, and 240 are arranged in parallel, and the input of each of the four ESC driving circuit units 210, 220, 230, and 240 is electrically connected to the output of the SOC integrated chip 108, respectively. In this way, the power of each of the multiple ESC driving circuit units is reduced, accordingly, the inference caused by the ESC driving circuit module 112 to other function modules operating within the weak electrical range can be effectively reduced. Also, the ESC driving circuit module 112 can be configured with other function modules which are operating within the weak electrical range, in the secondary circuit board 104, so that the reliability of the flight control system 100 is enhanced, and the structure is more compact.

In some embodiments, the four ESC driving circuit units 210, 220, 230, and 240 are symmetrically positioned adjacent to the edges of the secondary circuit board 104. This arrangement will further reduce interference of the ESC driving circuit module 112 with other function modules in the weak voltage range. The arrangement of the four ESC driving circuit units 210, 220, 230, and 240 is not limited to the above-described circumstances. For example, the ESC driving circuit units 112 can comprise other number of the ESC driving circuit units. Additionally or independently, the four ESC driving circuit units 210, 220, 230, and 240 are symmetrically positioned in the corner of the secondary circuit board 104.

As depicted in FIG. 2, each of the ESC driving circuit units 210, 220, 230, and 240 includes an ESC driving chip 212, 222, 232, and 242 and a set of motor driving signal line 214. In the example of FIG. 2, the number of motor driving signal line 214 is three. The signal input of the ESC driving chip 212 is electrically connected to the signal output of the SOC integrated chip 108, and the motor driving signal line 214 is electrically connected to the signal output of the ESC driving chip 212 and the shaft of a motor, respectively. In some embodiments, the wiring thickness of the motor driving signal line 214 on the circuit board 104 is at least 2 ounces, and the wiring width of the motor driving signal line 214 on the circuit board 104 is at least 1 mm.

In additional embodiments, each of the ESC driving circuit units 210, 220, 230, and 240 includes at least one differential sampling module, and each differential sampling module has two differential sampling signal lines. Also, this two differential sampling signal lines are arranged in the same layer of the secondary circuit board 104, which will ensure the differential signal impedance consistency. In the embodiment where the ESC driving circuit module 112 includes the four ESC driving circuit units 210, 220, 230, and 240, the eight differential signal lines of the four differential sampling modules of the four ESC driving circuit units 210, 220, 230, and 240 are arranged in the same layer of the secondary circuit board 104. Additionally, each of the ESC driving circuit units 210, 220, 230, and 240 includes an analog ground unit and a digital ground unit, both of which are electrically connected to the ESC driving chip 212; wherein the analog ground unit and the digital ground unit is separated and an end junction between the analog ground unit and the digital ground unit is positioned below the ESC driving chip 212.

Figure 3:
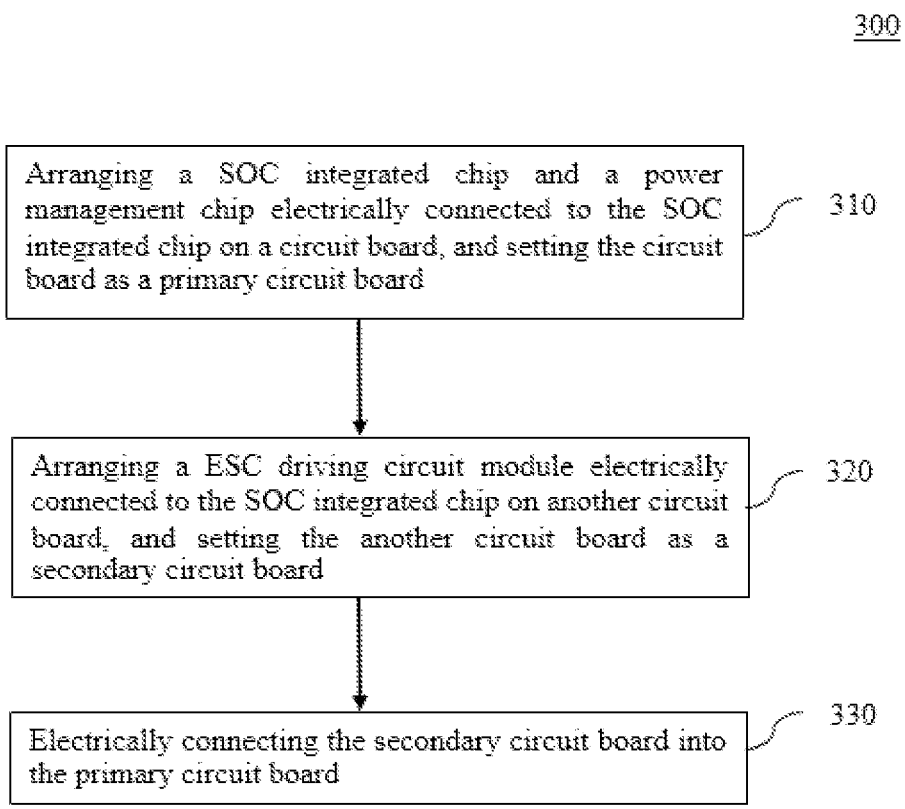
FIG. 3 is a flowchart of an example method for configuring a circuit board assembly of a flight control system, according to embodiments of the invention.

FIG. 3 is a flowchart of an example method 300 for configuring a circuit board assembly of a flight control system. In step 310, a SOC integrated chip and a power management chip electrically connected to the SOC integrated chip are arranged on a circuit board, which is set as a primary circuit board. As an example, the circuit board assembly may be used for a movable device like a UAV, where the primary circuit board is the UAV's control board.

In step 320, a ESC driving circuit module, which can be electrically connected to the SOC integrated chip, is arranged on another circuit board, and the another circuit board is set as a secondary circuit board. In an UAV example, the secondary circuit board is configured to complement the primary circuit board by performing auxiliary functions including, but not limited to, data storage, sensor measurement, and connectivity.

In step 330, the primary circuit board is electrically connected to the secondary circuit board. The electrical connection can take many forms, for example, by a connector.

Various embodiments have been described herein with reference to the accompanying drawings. It will, however, be evident that various modifications and changes may be made thereto, and additional embodiments may be implemented, without departing from the broader scope of the invention as set forth in the claims that follow.

Further, other embodiments will be apparent to those skilled in the art from consideration of the specification and practice of one or more embodiments of the invention disclosed herein. It is intended, therefore, that this disclosure and the examples herein be considered as exemplary only, with a true scope and spirit of the invention being indicated by the following listing of exemplary claims.

What is claimed is:

1. A flight control system, comprising:
   a primary circuit board;
   a secondary circuit board electrically connected to the primary circuit board;
   a system on chip (SOC) integrated chip;
   a power management chip configured to supply power to the SOC integrated chip;
   an electronic speed control (ESC) driving circuit module configured to control flight speed in response to an instruction from the SOC integrated chip, wherein the ESC driving circuit module comprises a plurality of ESC driving units arranged in parallel with each other and each having an input electrically connected to an output of the SOC integrated chip, such that a power of each of the plurality of ESC driving units is reduced and an inference caused by the ESC driving circuit module to other modules of the flight control system is reduced; and
   wherein the SOC integrated chip and the power management chip are arranged on the primary circuit board, and the ESC driving circuit board is arranged on the secondary circuit board.

2. The system of claim 1, further comprising at least one connector, the at least one connector being positioned between the primary circuit board and the secondary circuit board to be receptive to the primary circuit board and the secondary circuit board, respectively, such that the secondary circuit board and the primary circuit board are pluggable into each other.

3. The system of claim 2, wherein the at least one connector has 120 pins.

4. The system of claim 1, wherein the secondary circuit board is a multiple layers printed circuit board.

5. The system of claim 1, wherein each of the plurality of ESC driving units comprises at least one differential sampling module, a ESC driving chip, an analog ground unit, and a digital ground unit; wherein the analog ground unit and the digital ground unit is separated and an end junction between the analog ground unit and the digital ground unit is positioned below the ESC driving chip.

6. The system of claim 5, wherein the plurality of ESC driving units comprises four ESC driving units and the at least one differential sampling module comprises one differential sampling module, the four ESC driving units being symmetrically positioned adjacent to respective edges of the secondary circuit board.

7. The system of claim 6, wherein each of the four ESC driving units is symmetrically positioned in respective corner of the secondary circuit board.

8. The system of claim 6, wherein the at least one differential sampling module comprises two differential sampling signal lines, the two differential sampling signal lines being arranged on the same layer of the multiple layers printed circuit board.

9. The system of claim 8, wherein all of the differential sampling signal lines of the four ESC units are arranged on the same layer of the multiple layers printed circuit board.

10. The system of claim 1, wherein each of the plurality of ESC driving units comprises three motor driving signal lines, each of which connected to a motor having a thickness at least 2 ounce and a width at least 1 mm.

11. The system of claim 1, further comprising a flight sensor module arranged on the secondary circuit board.

12. The system of claim 11, wherein the flight sensor module comprises at least one sensor, the at least one sensor being selected from the group consisting of an inertial measurement sensor, a height sensor, an orientation sensor, a position sensor, and a distance sensor.

13. The system of claim 1, further comprising: a memory chip, a wifi chip, and a gyroscope; wherein the memory chip is arranged on the primary circuit board, a wifi chip and a gyroscope are arranged on the secondary circuit board.

14. The system of claim 1, further comprising: a memory chip, a wifi chip, and a gyroscope; wherein the memory chip, the wifi chip and the gyroscope are arranged on the secondary circuit board.

15. The system of claim 1, further comprising a baroceptor sensor module, wherein the baroceptor sensor module is arranged on an area of the secondary circuit board that has no through holes, and arranged in a distance from heat-dissipating electrical components such that the sampling data of the baroceptor sensor module is ensured.

16. A circuit board assembly of a flight control system, the assembly comprising:
a primary circuit board on which a SOC integrated chip and a power management chip electrically connected to the SOC integrated chip are arranged
a secondary circuit board on which an ESC driving circuit module electrically connected to the SOC integrated chip is arranged, wherein the ESC driving circuit module comprises a plurality of ESC driving units arranged in parallel with each other and each having an input electrically connected to an output of the SOC integrated chip, such that a power of each of the plurality of ESC driving units is reduced and an inference caused by the ESC driving circuit module to other modules of the flight control system is reduced; and
wherein the primary circuit board is electrically connected to the secondary circuit board.

17. The assembly of claim 16, further comprising at least one connector positioned between the primary circuit board and the secondary circuit board to be receptive to the secondary circuit board and the primary circuit board, respectively, such that the secondary circuit board and the secondary circuit board are pluggable into each other.

18. A method of configuring a circuit board assembly of a flight control system, the method comprising:
arranging a SOC integrated chip and a power management chip electrically connected to the SOC integrated chip on a circuit board, and setting the circuit board as a primary circuit board;
arranging a ESC driving circuit module electrically connected to the SOC integrated chip on another circuit board, and setting the another circuit board as a secondary circuit board, wherein the ESC driving circuit module comprises a plurality of ESC driving units arranged in parallel with each other and each having an input electrically connected to an output of the SOC integrated chip, such that a power of each of the plurality of ESC driving units is reduced and an inference caused by the ESC driving circuit module to other modules of the flight control system is reduced; and
electrically connecting the secondary circuit board into the primary circuit board.

* * * * *